(12) United States Patent
Steegmüller et al.

(10) Patent No.: US 8,076,166 B2
(45) Date of Patent: Dec. 13, 2011

(54) METHOD FOR FABRICATING AN OPTICALLY PUMPED SEMICONDUCTOR APPARATUS

(75) Inventors: Ulrich Steegmüller, Nortville, MI (US); Frank Singer, Regenstauf (DE); Thomas Schwarz, Regensburg (DE); Roland Schulz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 599 days.

(21) Appl. No.: 12/087,291

(22) PCT Filed: Dec. 29, 2006

(86) PCT No.: PCT/DE2006/002337
§ 371 (c)(1),
(2), (4) Date: Dec. 9, 2008

(87) PCT Pub. No.: WO2007/076845
PCT Pub. Date: Jul. 12, 2007

(65) Prior Publication Data
US 2009/0246898 A1    Oct. 1, 2009

(30) Foreign Application Priority Data

Dec. 30, 2005   (DE) .................. 10 2005 063 103
Apr. 12, 2006   (DE) .................. 10 2006 017 293

(51) Int. Cl.
H01L 21/00    (2006.01)
H01L 27/15    (2006.01)

(52) U.S. Cl. .......................................... 438/29; 257/84

(58) Field of Classification Search .............. 257/84, 257/797; 438/22–29
See application file for complete search history.

(56) References Cited

U.S. PATENT DOCUMENTS

| | | | |
|---|---|---|---|
| 5,637,885 A * | 6/1997 | Heinemann et al. | 257/84 |
| 5,696,862 A | 12/1997 | Hauer et al. | |
| 5,991,318 A | 11/1999 | Caprara et al. | |
| 6,072,815 A | 6/2000 | Peterson | |
| 6,128,134 A | 10/2000 | Feldman et al. | |
| 7,160,038 B2 * | 1/2007 | Kwak et al. | 385/93 |
| 7,223,952 B2 * | 5/2007 | Steegmuller et al. | 250/201.5 |
| 2003/0122142 A1 | 7/2003 | Tatum et al. | |
| 2004/0069933 A1 | 4/2004 | Steegmuller et al. | |
| 2005/0063462 A1 | 3/2005 | Lee | |
| 2005/0147360 A1 | 7/2005 | Kwak et al. | |

FOREIGN PATENT DOCUMENTS

| | | |
|---|---|---|
| DE | 102 53 907 | 4/2004 |
| DE | 698 15 860 | 5/2004 |
| DE | 103 13 608 | 10/2004 |
| DE | 10 2004 025 661 | 4/2005 |
| DE | 10 2004 012 014 | 10/2005 |
| DE | 10 2004 050 118 | 3/2006 |
| EP | 0 939 464 | 9/1999 |
| JP | 2005-202082 | 7/2005 |
| TW | 523809 | 3/2003 |
| TW | 200305305 | 10/2003 |

(Continued)

*Primary Examiner* — Calvin Lee
(74) *Attorney, Agent, or Firm* — Cozen O'Connor

(57) ABSTRACT

A method for fabricating an optically pumped semiconductor apparatus, having the following steps: provision of a connection carrier assembly (50) comprising a plurality of connection carriers (14) which are permanently connected to one another mechanically, arrangement of a surface-emitting semiconductor body (1) on a connection carrier (14) in the connection carrier assembly (50), and separation of the connection carrier assembly (50) into individual semiconductor apparatuses.

15 Claims, 13 Drawing Sheets

FOREIGN PATENT DOCUMENTS

| | | |
|---|---|---|
| TW | I246242 | 12/2005 |
| WO | WO 02/08806 | 1/2002 |
| WO | WO 03/058720 | 7/2003 |
| WO | WO 2006/012819 | 2/2006 |
| WO | WO 2006/032252 | 3/2006 |

* cited by examiner

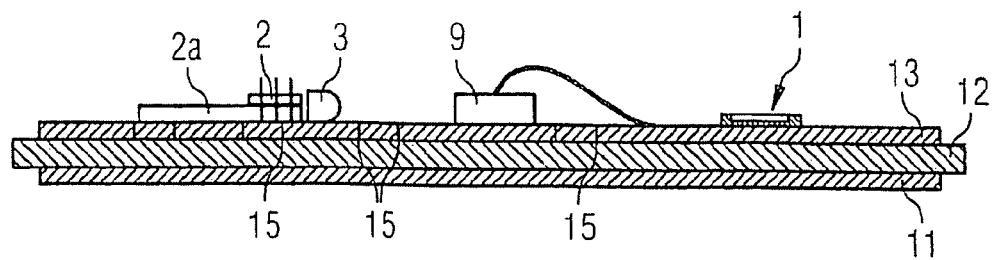
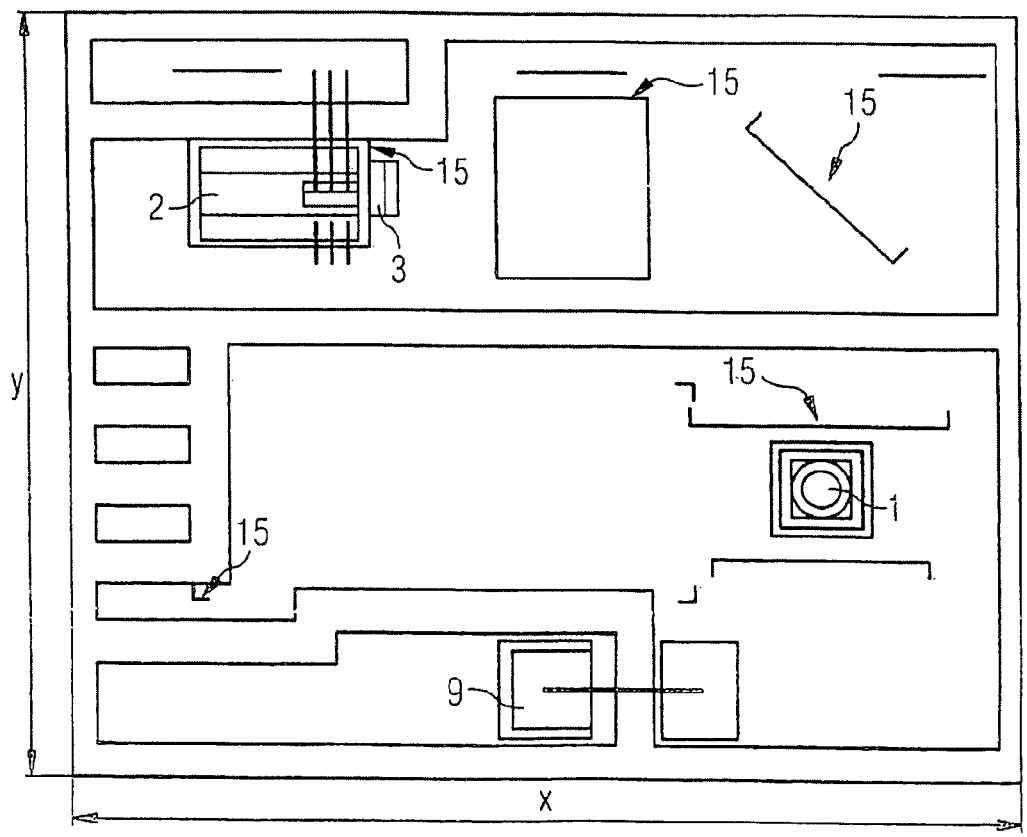

METHOD FOR FABRICATING AN OPTICALLY PUMPED SEMICONDUCTOR APPARATUS

RELATED APPLICATIONS

This is a U.S. national stage under 35 USC 371 of application No. PCT/DE2006/002337, filed on 29 Dec. 2006.

This application claims the priority of German applications no. 10 2005 063 103.7 filed Dec. 30, 2005 and no. 10 2006 017 293.0 filed Apr. 12, 2006, the entire content of both of which is hereby incorporated by reference.

FIELD OF THE INVENTION

The invention specifies a method for fabricating an optically pumped semiconductor apparatus.

SUMMARY OF THE INVENTION

One object of the invention is to provide a method which can be used to fabricate a semiconductor apparatus particularly inexpensively.

This and other objects are attained in accordance with one aspect of the present invention directed to a method for fabricating an optically pumped semiconductor apparatus, comprising the steps of: providing a connection carrier assembly comprising a plurality of connection carriers which are permanently connected to one another mechanically; arranging a surface-emitting semiconductor body on a connection carrier in the connection carrier assembly; and at least partially finishing the semiconductor apparatus.

In line with at least one embodiment of the method, the method comprises a method step in which a connection carrier assembly is provided. The connection carrier assembly is preferably a blank which comprises a plurality of connection carriers. This means that the connection carrier assembly comprises a plurality of connection carriers which are permanently connected to one another mechanically. Each connection carrier in the connection carrier assembly forms a separate connection carrier after the connection carrier assembly has been separated. Preferably, the connection carrier assembly comprises similar connection carriers. Before the assembly is separated, the connection carriers in a connection carrier assembly may be electrically conductively connected to one another.

A connection carrier in the connection carrier assembly comprises, by way of example, a basic body which consists of an electrically insulating material which is a good conductor of heat. The surface of the connection carrier has interconnects made of an electrically conductive material disposed on it. By way of example, the interconnects can be used to make electrical contact with a semiconductor component which is disposed on the connection carrier. Preferably, all connection carriers in the connection carrier assembly comprise a common basic body by means of which the connection carriers in the assembly are mechanically connected to one another.

In line with at least one embodiment of the method, a surface-emitting semiconductor body is arranged on a connection carrier in the connection carrier assembly. Preferably, each connection carrier in the connection carrier assembly has a surface-emitting semiconductor body arranged on it. Particularly preferably, each connection carrier in the assembly has precisely one surface-emitting semiconductor body arranged on it. Preferably, the surface-emitting semiconductor bodies are similar semiconductor bodies having the same or similar physical properties. For example, these semiconductor bodies may be produced together.

The semiconductor body preferably has a radiation passage area through which electromagnetic radiation can be input into the semiconductor body and output from the semiconductor body. In particular, the semiconductor body can be optically pumped through the radiation passage area. This means that pump radiation which is input into the semiconductor body through the radiation passage area prompts the production of electromagnetic radiation in the semiconductor body, which radiation then in turn leaves the semiconductor body through the radiation passage area. In this case, the semiconductor body is suitable for producing laser radiation using an externally arranged resonator mirror, that is to say one that is arranged at a distance from the semiconductor body. Preferably, the semiconductor body is arranged on the connection carrier such that its radiation passage area is directed away from the connection carrier. Particularly preferably, the radiation passage area runs parallel to the connection carrier in this case.

In line with at least one embodiment of the method, the connection carrier assembly is separated into individual connection carriers in a further method step. The individual connection carriers are then connection carriers for one optically pumped semiconductor apparatus each.

In line with at least one embodiment of the method for fabricating an optically pumped semiconductor apparatus, the method has the following steps: first of all, a connection carrier assembly comprising a plurality of connection carriers which are permanently connected to one another mechanically is provided. Next, a surface-emitting semiconductor body is arranged on one connection carrier in the connection carrier assembly. In a concluding method step, individual semiconductor apparatuses are fabricated by separating the connection carrier assembly, for example.

In line with at least one embodiment, the method comprises a further method step, in which a pump radiation source is disposed on a connection carrier in the connection carrier assembly. The pump radiation source may comprise an edge-emitting semiconductor laser or an edge-emitting semiconductor laser bar, for example. In addition, the pump radiation source may comprise a thermally conductive element which has the semiconductor laser disposed on it. Preferably, precisely one pump radiation source is arranged on each connection carrier in the assembly, said pump radiation source being suitable for optically pumping the surface-emitting semiconductor body arranged on the same connection carrier.

In line with at least one embodiment, one method step in the method described here involves an optical element, which is suitable for directing pump radiation onto a radiation passage area of the semiconductor body, being arranged on a connection carrier in the connection carrier assembly. Preferably, at least one such optical element is arranged on each connection carrier in the connection carrier assembly. Preferably, the optical element is arranged on the connection carrier such that it is suitable for directing pump radiation onto the radiation passage area of the semiconductor body. This means that during operation of the finished semiconductor apparatus no pump radiation is directed from a pump radiation source directly onto the radiation passage area of the semiconductor body, but rather the pump radiation passes through or hits at least one optical element which directs the pump radiation onto the radiation passage area of the semiconductor body.

In line with at least one embodiment of the method, the optical element is suitable for directing the pump radiation onto the radiation passage area of the semiconductor body through optical refraction. That is to say that when passing through the radiation passage areas of the optical element, the pump radiation is deflected due to the difference between a refractive index of the optical element and that of the surrounding material—for example air—such that the pump radiation is directed onto the radiation passage area of the semiconductor body after passing through the optical element.

In line with at least one embodiment of the method, the optical element is suitable for directing the pump radiation onto the radiation passage area of the semiconductor body through a reflection. That is to say that the optical element is a reflective optical element. Preferably, the optical element is suitable for directing the pump radiation onto the radiation passage area of the semiconductor body through a single reflection. That is to say that the optical element is preferably not an optical fiber, in which the pump radiation is deflected by a plurality of reflections. By way of example, the optical element is a highly reflective mirror.

During operation of the semiconductor apparatus fabricated in line with the method, pump radiation runs parallel or essentially parallel to the radiation passage area of the semiconductor body at first, for example at least in sections. By way of example, the pump radiation can run over the radiation passage area of the semiconductor body. That means that the pump radiation first of all runs over the semiconductor body without hitting the semiconductor body. The reflective optical element is then arranged downstream of the semiconductor body in the direction of the pump radiation. After it has crossed the semiconductor body and hence the radiation passage area of the semiconductor body, the pump radiation hits the reflective optical element. The reflective optical element directs the pump radiation onto the radiation passage area of the semiconductor body through a reflection. In this context, the deflected pump radiation can—at least for a short distance—run in the opposite direction to the direction of the pump radiation which the pump radiation has before it hits the reflective optical element.

In line with at least one embodiment of the method, the optical element is arranged such that it is suitable for directing the pump radiation in the direction of the mounting plane of the semiconductor body. That is to say that the pump radiation, before hitting the optical element, first of all runs parallel to the mounting plane or is directed away from the mounting plane for a particular distance. In any case, the pump radiation runs at a particular height above the mounting plane and preferably also above the radiation passage area of the semiconductor body for this distance. The optical element is suitable for directing the pump radiation downward—in the direction of the mounting plane and hence in the direction of the radiation passage area of the semiconductor body.

In line with at least one embodiment of the method, the semiconductor body is arranged in the mounting plane of the semiconductor body between the pump radiation source and the optical element. That is to say that pump radiation runs over the semiconductor body before it is directed onto the radiation passage area of the semiconductor body. By way of example, it is possible for the pump radiation source, the semiconductor body and the optical element to be arranged in this order along a straight line.

In line with at least one embodiment of the method for fabricating an optically pumped semiconductor apparatus, the connection carriers in the connection carrier assembly are arranged in the manner of a matrix. That is to say that the connection carrier assembly has a plurality of rows and columns, each connection carrier in the connection carrier assembly forming a matrix element. That is to say that each connection carrier in the assembly has a uniquely associated particular row and column number. The matrix-like design of the connection carrier assembly allows a multiplicity of elements in the assembly to be simultaneously arranged on the connection carrier assembly and hence on each individual connection carrier of the assembly in particularly simple fashion, for example.

Thus, in line with at least one embodiment of the method, similar elements in the assembly are disposed on the connection carrier assembly. By way of example, the similar elements may be optical elements. The optical elements may be in the form of a strip-like assembly, for example. Each assembly comprises a number of optical elements which may correspond to the number of columns in the connection carrier assembly, for example. Preferably, one such assembly of similar elements is arranged in at least two rows of the connection carrier assembly. Particularly preferably, each row of the connection carrier assembly has one such assembly of similar elements arranged in it. That is to say that each connection carrier in the assembly then holds the same number of elements, for example precisely one such element each. In this case, components can be fitted to the individual rows of the connection carrier assembly sequentially or simultaneously.

In line with at least one embodiment, the connection carrier assembly has at least two primary alignment markers. The primary alignment markers on the connection carrier assembly are used for orienting the connection carrier assembly, for example in a pick-and-place machine using an image processing system. At least the approximate deposit positions for the individual elements on the individual connection carriers in the connection carrier assembly can then be calculated on the basis of the position of the two primary alignment markers. In this context, "at least approximate" means that at least the position of individual connection carriers in the assembly can be calculated from the primary alignment markers. The connection carriers themselves may then have further orientation aids, for example secondary alignment markers, arranged on them for the image processing system.

By way of example, the primary alignment markers may be situated in two diagonally opposite corners of the connection carrier assembly on the top of the connection carrier assembly, on which the aforementioned elements have been deposited. The primary alignment markers may be patternings on a connection carrier assembly or alignment chips which are mounted on the connection carrier assembly before the connection carrier assembly has components fitted.

In line with at least one embodiment, at least one connection carrier in the connection carrier assembly has at least one secondary alignment marker. Preferably, each connection carrier in the assembly has at least one secondary alignment marker. Particularly preferably, each connection carrier has a plurality of secondary alignment markers. The secondary alignment markers are formed by deposit patterns, for example, which mark the deposit position for individual elements on the connection carrier. The deposit patterns may be photographically patterned thin layers, for example.

In line with at least one embodiment of the method, one method step involves a resonator top element being arranged on a connection carrier in the assembly. Preferably, each connection carrier in the assembly has precisely one resonator top element arranged on it. In this connection, the resonator top element is arranged such that it is arranged downstream of the radiation passage area of the semiconductor body in a primary radiation direction of the semiconductor body.

By way of example, the resonator top element comprises a second carrier—an individual carrier which has a resonator mirror mounted on it. The resonator top element is preferably arranged parallel or essentially parallel to the mounting plane of the semiconductor body above the mounting plane of the semiconductor body.

By way of example, each connection carrier has spacing elements arranged on it which have the resonator top element mounted on them. The spacing elements are mounted on the connection carrier, for example. The spacing elements have the resonator top element mounted on them.

In line with at least one embodiment, the spacing element comprises an optical element or the spacing element is formed from an optical element. By way of example, the spacing element may in this case comprise the optical element or consist of the optical element which is suitable for directing pump radiation onto the radiation passage area of the semiconductor body. In addition, however, it is also possible for spacing elements of the semiconductor apparatus to perform other optical functions. By way of example, one of the spacing elements may be suitable for altering the direction of the pump radiation, so that the pump radiation is directed away from the mounting plane of the semiconductor body after passing through the spacing element.

In line with at least one embodiment of the method, a resonator top element for arrangement on a connection carrier is produced by means of the following steps: first of all, a carrier assembly is provided. The carrier assembly preferably comprises a plurality of individual carrier regions which are permanently connected to one another mechanically.

In line with at least one embodiment of the method, each individual carrier region has a resonator mirror arranged on it. Preferably, each individual carrier region has precisely one resonator mirror arranged on it. In a further method step, the resonator top element is finished by separating the carrier assembly into individual carriers, for example.

In line with at least one embodiment of the method, a radiation deflection element is arranged on an individual carrier region of the carrier assembly. Preferably, the radiation deflection element is a deflection mirror which is highly reflective for the electromagnetic radiation from the fundamental wavelength which circulates in the resonator. Preferably, each individual carrier region has precisely one deflection element arranged on it. By way of example, the deflection element may be a deflection mirror. Electromagnetic radiation emitted by the semiconductor body during operation first of all hits the deflection element and from there hits the resonator mirror. The resonator mirror in turn reflects the laser radiation onto the deflection element, which directs the radiation through the radiation passage area into the semiconductor body. By way of example, the semiconductor body comprises a reflective layer sequence, for example a Bragg mirror, which forms a further resonator mirror for the laser resonator formed in this manner.

In line with at least one embodiment of the method, the individual carriers in the carrier assembly are arranged in the manner of a matrix. That is to say that the carrier assembly comprises a plurality of rows and columns, each individual carrier region of the carrier assembly forming a matrix element. That is to say that each individual carrier in the carrier assembly has a uniquely associated particular row and column number. By way of example, the matrix-like form of the carrier assembly allows a multiplicity of elements in the assembly to be simultaneously arranged on the carrier assembly and hence on each individual carrier region in particularly simple fashion. Thus, in line with at least one embodiment of the method, similar elements in the assembly are disposed on the carrier assembly. By way of example, the similar elements may be optical elements such as resonator mirrors. The optical elements may be in the form of a strip-like assembly, for example. Such a strip-like assembly preferably comprises a number of optical elements which corresponds to the number of columns in the carrier assembly. Preferably each row of the carrier assembly contains one such strip-like assembly of similar elements, so that each individual carrier region of the assembly holds the same number of these elements—for example in each case precisely one such element. In this case, individual rows of the carrier assembly may have components fitted sequentially or simultaneously.

In line with at least one embodiment of the method, at least one element is mounted on an individual carrier region of the carrier assembly by means of bonding. Preferably, at least one element is mounted on each individual carrier region by means of bonding. By way of example, the elements can be mounted by means of direct bonding or anodic bonding. The elements are preferably at least one of the following elements: deflection element, resonator mirror, frequency converting element. In particular, bonding can also be used to mount the elements arranged on the carrier assembly simultaneously.

In line with at least one embodiment of the method, a patterned metal coating is disposed on an individual carrier region before the elements are arranged on the carrier assembly. Preferably, a patterned metal coating is disposed on each individual carrier region. The metal coating preferably has electrical contact points for making contact with the metal coating. Preferably, each individual carrier region comprises a metal coating which can be used to raise and/or ascertain the temperature of the resonator top element in the semiconductor apparatus fabricated in line with the method. Preferably, the temperature of the resonator top element can be raised and ascertained using the metal coating. The metal coating is preferably a patterned metal coating. By way of example, the metal coating is in meandrous form or the metal coating has a plurality of recesses. The metal coating preferably contains or consists of at least one of the following metals: platinum, gold.

The metal coating preferably also has contact points which can be used to make electrical contact with the metal coating. Passing the current through the metal coating allows the temperature of the resonator top element to be raised in targeted fashion during operation of the finished semiconductor apparatus. In this way, it is possible to heat the frequency conversion element to a prescribable operating temperature, for example. In addition, the temperature of the metal coating and hence the temperature of the resonator top element and of the frequency conversion element can be ascertained—for example by measuring the temperature-dependant electrical resistance of the metal coating.

Preferably, the metal coating is to this end connected to a control apparatus which is suitable for setting and regulating an externally prescribable temperature of the metal coating. For example, the control apparatus may comprise a microcontroller. The control apparatus may be arranged on the connection carrier of the semiconductor apparatus. To this end, one other step of the method for fabricating an optically pumped semiconductor apparatus may involve a control apparatus being arranged on each connection carrier in the connection carrier assembly. However, it is also possible for the control apparatus to be arranged outside of the semiconductor apparatus and to be electrically conductively connected to the semiconductor apparatus.

In line with at least one embodiment of the method, each resonator top element is electrically conductively connected to the connection carrier on which the resonator top element is arranged. This can be done by means of connecting wires, for example, which connect the contact points of the metal coating to the connection carrier.

BRIEF DESCRIPTION OF THE DRAWINGS

The method described here and the semiconductor apparatus fabricated in line with the method described here are explained in more detail below using exemplary embodiments and with reference to the associated figures.

FIG. 2G shows a schematic side view of the pump unit in the semiconductor apparatus fabricated in line with the method described here, based on the third exemplary embodiment, before passive optical elements are fitted, and FIG. 2H shows the associated schematic plan view.

In connection with FIGS. 4A to 4D, a method of fabrication is described for fabricating the resonator mirror 31, as used in line with an exemplary embodiment of the method described here.

Figure 5:
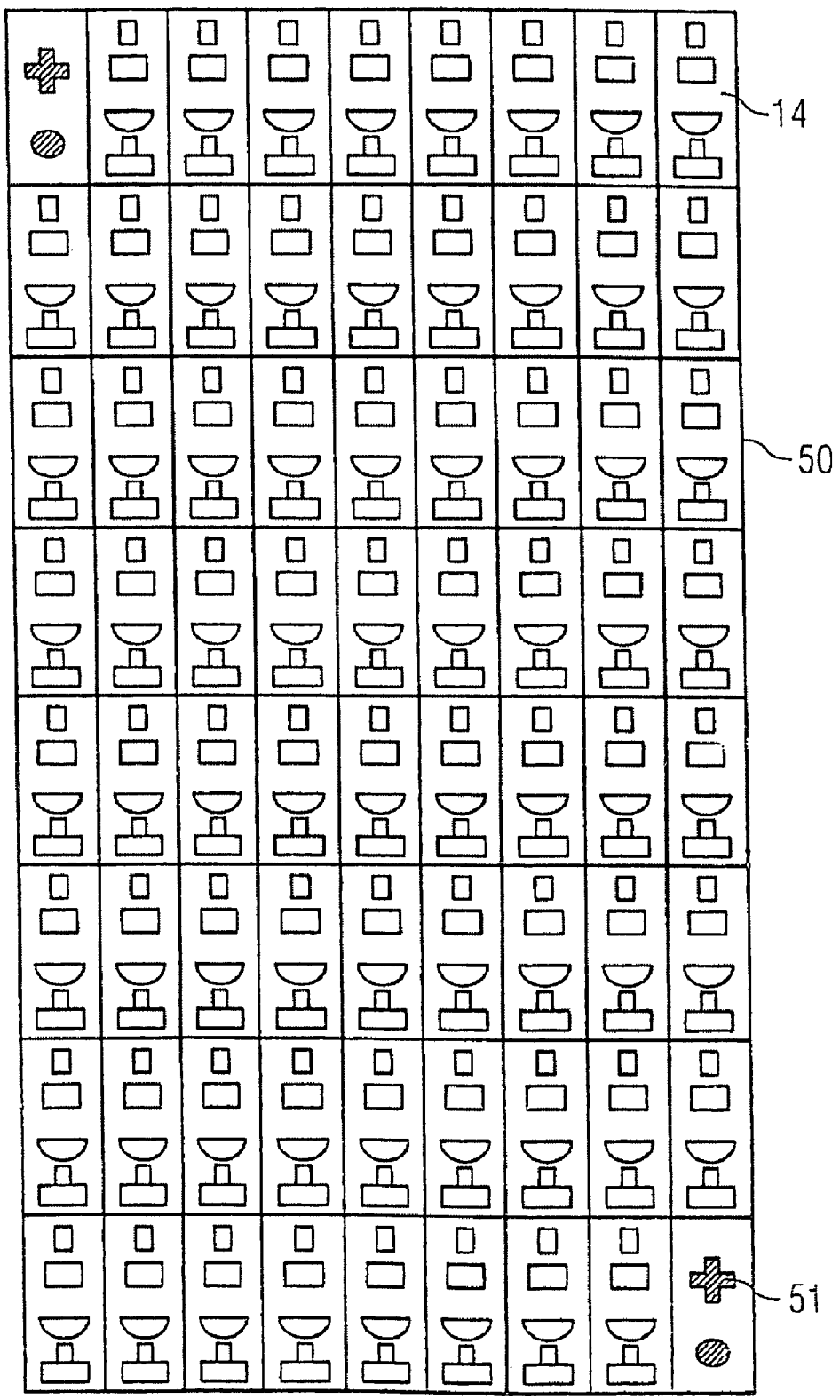

FIG. 5 shows a connection carrier assembly 50 with a multiplicity of connection carriers 14 arranged in the manner of a matrix, as used in an exemplary embodiment of the method described here.

Figure 6A:
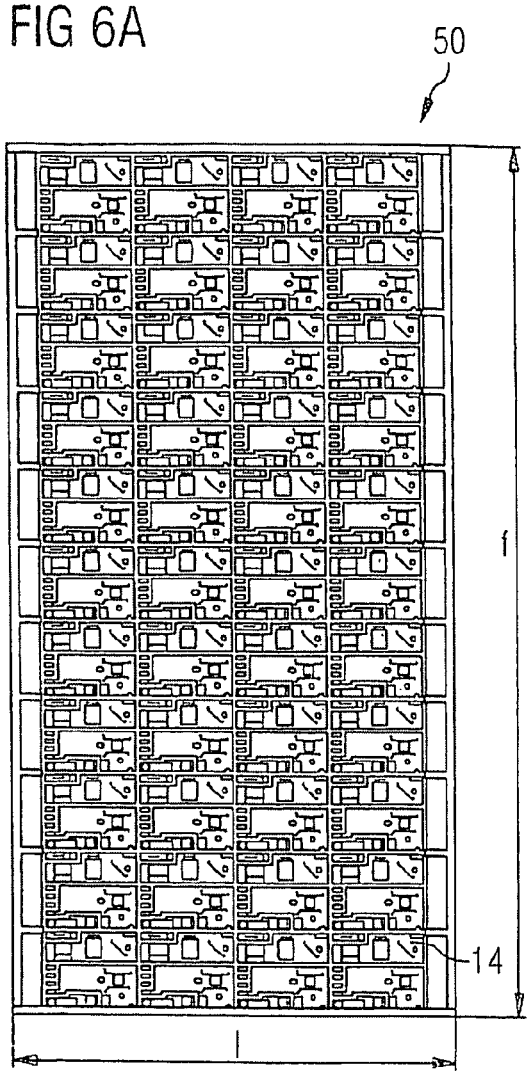

FIG. 6A shows a schematic plan view of a connection carrier assembly 50 with a multiplicity of connection carriers 40 arranged in the manner of a matrix, as used in a further exemplary embodiment of the method described here.

Figure 6B:
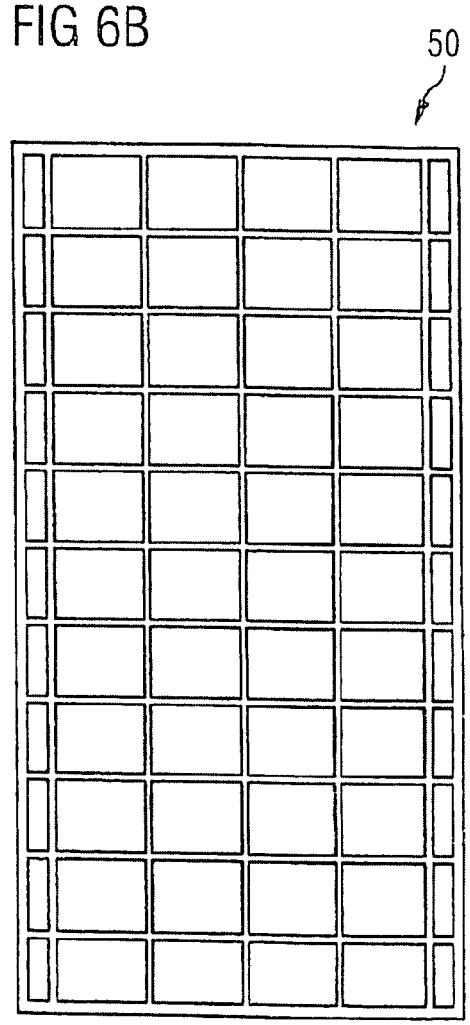

FIG. 6B shows a schematic plan view of the back of the connection carrier 50.

Figure 6C:
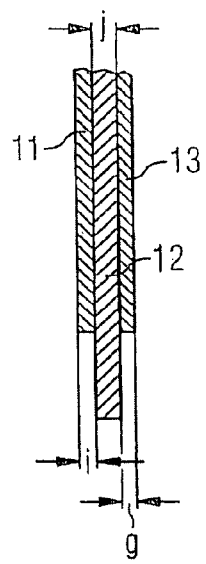

FIG. 6C shows a schematic side view of the connection carrier 50.

Figure 6D:
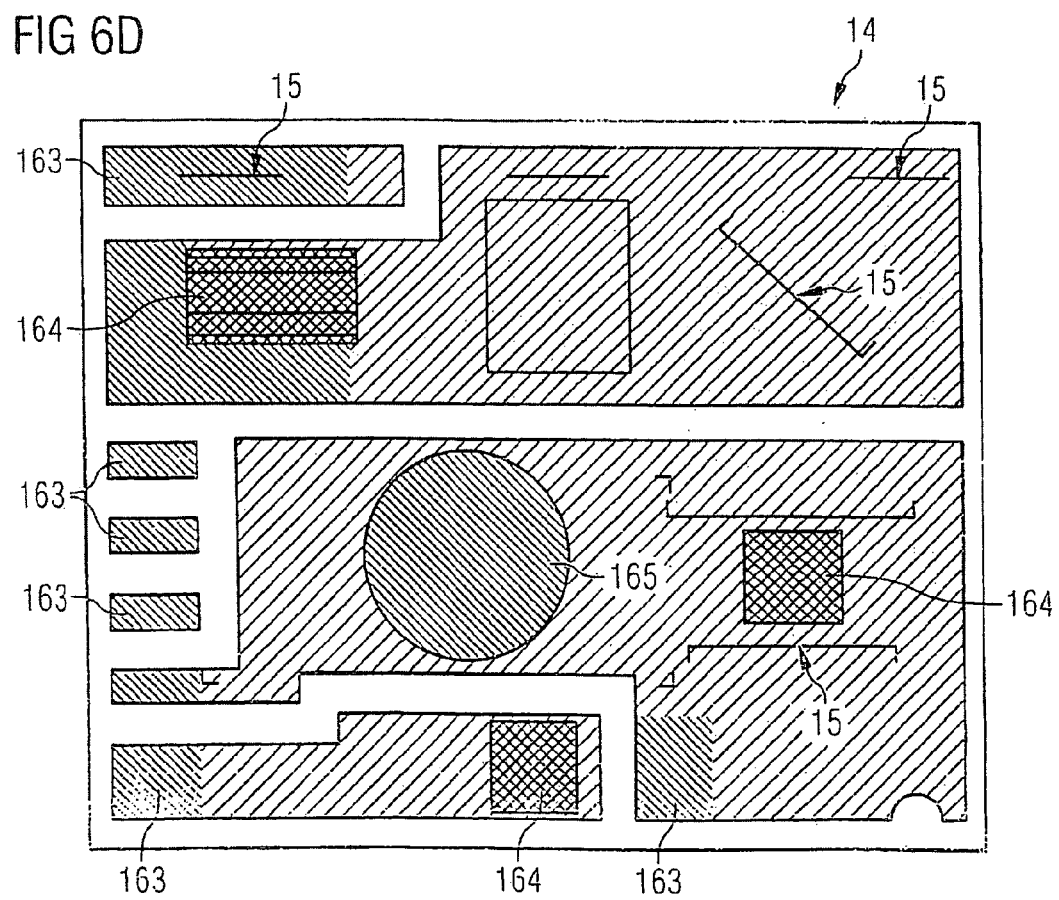

FIG. 6D shows a schematic plan view of a connection carrier 14 in the connection carrier assembly 50.

DETAILED DESCRIPTION OF THE DRAWINGS

In the exemplary embodiments and figures, parts which are the same or have the same action are in each case provided with the same reference symbols. The elements shown should not be considered as being true to scale, but rather individual elements may be shown in an exaggerated size as an aid to understanding.

Figure 1A:
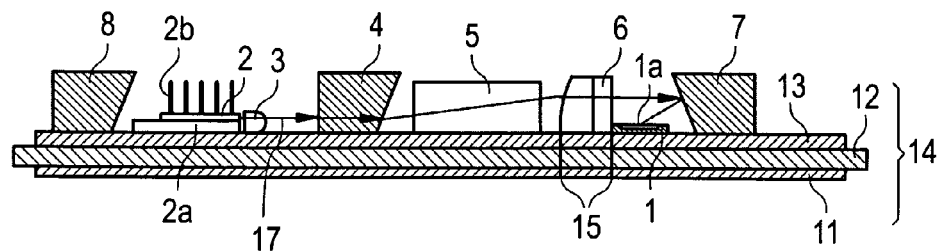
FIG. 1A shows a schematic sectional view of the pump unit in a semiconductor apparatus fabricated in line with the method described here, based on a first exemplary embodiment of the semiconductor apparatus.

FIG. 1A shows a schematic sectional view of the pump unit in a semiconductor apparatus fabricated in line with the method described here, based on a first exemplary embodiment of the semiconductor apparatus.

The pump unit comprises a connection carrier 14. The base area of the surface-emitting semiconductor laser apparatuses described here—that is to say the base area of the connection carrier 14—is preferably between 30 and 150 square millimeters. In the exemplary embodiment shown here, the connection carrier 14 comprises a basic body 12, a bottom metallization 11 and a patterned top metallization 13. The connection carrier 14 is preferably a direct bonded copper (DBC) composite. By way of example, the basic body 12 consists of a ceramic material such as an AlN. The thickness of the basic body 12 is preferably between 0.2 and 0.5 mm, particularly preferably 0.38 mm. The top metallization 13 and the bottom metallization 11 consist of copper, for example, and have a thickness between 0.1 and 0.3 mm, preferably 0.2 mm. Advantageously, copper has a high thermal conductivity of approximately 400 watts per meter Kelvin. The compound structure with the AlN basic body 12 lowers the effective coefficient of thermal expansion of the connection carrier 14 on its surface. This benefits the mounting of semiconductor bodies with low expansion coefficients.

The patterned top metallization 13 forms interconnects which can be used to make electrical contact with active semiconductor components mounted on the connection carrier 14.

As an alternative to the connection carrier 14 described in connection with FIG. 1A, it is also possible to use a connection carrier 14 which comprises a ceramic basic body 12, for example consisting of AlN. The top of the basic body 12 may then have a top metallization 13 disposed on it. To this end, a gold metallization, for example, is patterned directly onto the basic body 12—for example by means of sputtering or vapor deposition—using a mask. In this case, the thickness of the gold layer is no more than 1 μm, preferably no more than 500 mm. A connection carrier of this kind is distinguished from a DBC connection carrier by a particularly smooth surface. In this context, the thickness of the basic body 12 is preferably no more than 1 mm, particularly preferably no more than 0.7 mm. Metal blockers—for example for a solder material—which may consist of platinum or NiCr, for example, or contain at least one of these materials can be deposited and patterned directly onto the connection carrier 14 by means of vapor deposition or sputtering.

The connection carrier 14 has a surface-emitting semiconductor body 1 disposed on it. By way of example, the surface-emitting semiconductor body 1 is soldered or bonded on the connection carrier 14. Preferably, the surface-emitting semiconductor body 1 is mounted on the connection carrier 14 by means of a solder connection. This is particularly suited to a thin layer solder. That is to say that the surface-emitting semiconductor body 1 is mounted using a solder which is deposited by means of sputtering or vapor deposition. The solder preferably contains or consists of at least one of the following materials: AuSn, Sn, SnAg, In, InSn. Preferably, the thickness of the solder layer is between 1 and 5 μm.

The surface-emitting semiconductor body 1 comprises a reflective layer sequence and a radiation-producing layer sequence. The reflective layer sequence is preferably a reflective metal layer, a Bragg mirror or a combination of these reflective layers. Preferably, the reflective layer sequence is a Bragg mirror which has a plurality of semiconductor layer pairs with an advantageously high refractive index difference. Preferably, the Bragg mirror comprises a sequence of 20 to 30 or more semiconductor layer pairs, which results in particularly high reflectivity for the mirror of 99.9% or higher. The Bragg mirror is advantageously fabricated epitaxially together with the other semiconductor layers of the semiconductor body 1. The Bragg mirror is preferably arranged on that side of the semiconductor body 1 which faces the connection carrier 14.

The radiation-producing layer sequence of the semiconductor body comprises an active region with a pn junction and/or a single quantum well structure and/or preferably a multiple quantum well structure—particularly preferably an undoped multiple quantum well structure—which is suitable for producing radiation. Within the context of the description, the term quantum well structure particularly also covers that structure which prompts charge carriers to undergo quantization of their energy states through confinement. In particular, the term quantum well structure does not contain any indication of the dimensionality of the quantization. It therefore covers, inter alia, quantum wells, quantum wires and quantum dots and any combination of these structures.

Preferably, the radiation-emitting layer sequence is based on an III-V compound semiconductor material. That is to say that the radiation-emitting layer sequence comprises at least one layer which consists of an III-V compound semiconductor material. Preferably, the radiation-emitting layer sequence is based on a nitride, phosphide or particularly preferably arsenide compound semiconductor.

In the present context, "based on nitride compound semiconductors" means that the radiation-emitting layer sequence or at least one layer from it comprises a nitride V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition based on the above formula. Rather, it may have one or more dopants and also additional components which do not significantly change the characteristic physical properties of the $Al_nGa_mIn_{1-n-m}N$ material. For the sake of simplicity, however, the above formula contains only the major components of the crystal lattice (Al, Ga, In, N), even if some of these can be replaced by small amounts of other substances.

In this context, "based on phosphide compound semiconductors" means that the radiation-emitting layer sequence or at least one layer from it preferably comprises $Al_nGa_mIn_{1-n-m}P$, where $0 \leq n \leq 1$, $0 \leq m \leq 1$ and $n+m \leq 1$. In this context, this material need not necessarily have a mathematically exact composition based on the above formula. Rather, it may have one or more dopants and also additional components which do not significantly change the physical properties of the material. For the sake of simplicity, however, the above formula contains only the major components of the crystal lattice (Al, Ga, In, P), even if some of these can be replaced by small amounts of other substances.

In this context, "based on arsenide compound semiconductors" means that the radiation-emitting layer sequence or at least one layer from it preferably comprises $Al_nGa_mIn_{1-n-m}As$, where $0 \leq n \leq 1$, $0 \leq m \leq 1$ and $n+m \leq 1$. In this case, this material need not necessarily have a mathematically exact composition based on the above formula. Rather, it may have one or more dopants and also additional components which do not significantly change the physical properties of the material. For the sake of simplicity, however, the above formula contains only the major components of the crystal lattice (Al, Ga, In, As), even if some of these can be replaced by small quantities of other substances.

These materials are distinguished by high internal quantum efficiencies which can be achieved in a simplified manner, and are suitable for radiation from the ultraviolet spectral range, in particular nitride-based compound semiconductor material, through the visible spectral range, in particular phosphide-based compound semiconductor materials, to the infrared spectral range, in particular arsenide-based compound semiconductor materials.

The radiation-producing layer sequence in a semiconductor body is preferably based on an arsenide compound semiconductor material. Radiation in the infrared spectral range, particularly in the wavelength range between 800 nm and 1100 nm, can be produced particularly efficiently in this material system. By way of example, the carrier gallium arsenide and the radiation-emitting layer sequence or at least one layer from it is based on the material system $Al_nGa_mIn_{1-n-m}As$, where $0 \leq n \leq 1$, $0 \leq m \leq 1$ and $n+m \leq 1$.

In addition, the connection carrier 14 has a pump radiation source 2 arranged on it. By way of example, the pump radiation source 2 comprises an edge-emitting semiconductor laser and a thermal element 2a. The thermally conductive element 2a preferably consists of a material with good thermal conductivity, such as diamond, aluminum nitride or silicon carbide, or contains at least one of these materials. The pump radiation source 2 is electrically conductively connected to the connection carrier 14 by means of connecting wires 2b. Preferably, the pump radiation source 2 is mounted on the connection carrier 14 by means of a solder connection. This is particularly suited to a thin-layer solder. That is to say that the pump radiation source 2 is mounted by means of a solder which is deposited by sputtering or vapor deposition. The solder preferably contains or consists of at least one of the following materials: AuSn, Sn, SnAg, In, InSn. Preferably, the thickness of the solder layer is between 1 and 5 μm.

The pump radiation source 2 has a lens 3 downstream of it. By way of example, the lens 3 is used for fast axis collimation (FAC) of the pump radiation 17 emitted by the pump radiation source 2. To this end, the lens 3 has an aspherically curved radiation outlet area and may consist of a highly refractive material such as GaP, for example.

The lens 3 has a further optical element 4 arranged downstream of it in the main radiation direction of the pump radiation source 2. The optical element 4 is preferably suitable for refracting the passing pump radiation. By way of example, the optical element 4 is suitable for refracting or directing the pump radiation 17 away from the connection carrier 14. The optical element 4 preferably contains a glass.

The optical element 4 has a cylinder lens 5 and a spherical lens 6 arranged downstream of it. The lenses 5, 6 are used for slow axis collimation (SAC) and/or fast axis collimation of the passing pump radiation. By way of example, the two lenses 5, 6 may also be replaced by a single cylinder lens with an aspherically curved radiation passage area. From the lenses 5, 6, the pump radiation is routed to the deflection element 7.

By way of example, the deflection element 7 contains a glass, with the area which faces the surface-emitting semiconductor body having a highly reflective coating for the pump radiation. The deflection element 7 directs the impinging pump radiation onto the radiation passage area 1a of the surface-emitting semiconductor body 1 such that pump radiation 17 hits the radiation passage area 1a preferably at an acute angle.

In addition, a spacing element 8 may be arranged on the carrier 14. The elements 8, 4, 7 may be elements which are shaped in the same manner and consist of the same material. They are then distinguished merely by surfaces in reflective, antireflection-coated or uncoated form and their orientation on the connection carrier 14. Elements 8, 4 and 7 retain resonator top element 40 (see below) spaced from semiconductor body 1. Spacing element 8 has no optical purpose.

Figure 1B:
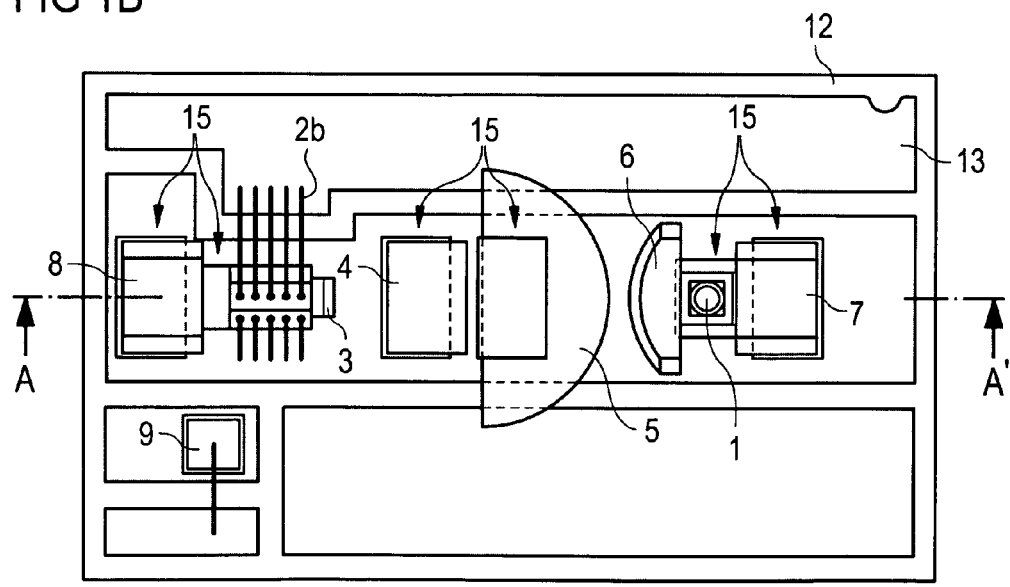
FIG. 1B shows a schematic plan view of the pump unit in the semiconductor apparatus fabricated in line with the method described here, based on the first exemplary embodiment.

FIG. 1B shows a schematic plan view of the semiconductor apparatus fabricated in line with the method described here, based on the first exemplary embodiment.

As can be seen from FIG. 1B, the connection carrier 14 also holds a temperature sensor 9 which comprises an NTC resistor, for example. The temperature sensor 9 can be used to ascertain the average temperature of the connection carrier 14. Depending on the average temperature of the connection carrier 14, it is possible to use a thermo electric cooler, for example, which may be arranged on the bottom of the connection carrier 14, for example, to set an operating temperature for the pump unit. Preferably, the operating temperature of the pump unit is between 20 and 35° C., particularly preferably 25° C.

Figure 1C:
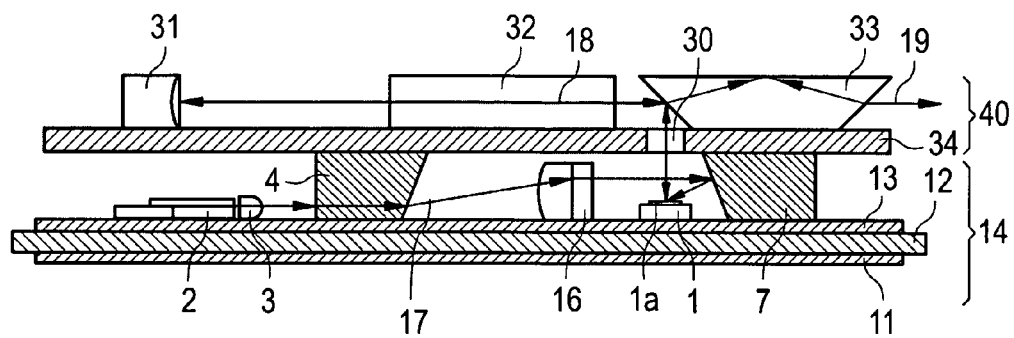
FIG. 1C shows a schematic sectional view of a semiconductor apparatus fabricated in line with the method described here, based on a second exemplary embodiment.

FIG. 1C shows a schematic sectional view of a semiconductor apparatus fabricated in line with the method described here, based on a second exemplary embodiment.

In this case, the pump unit has a resonator top element 40 arranged downstream of the surface-emitting semiconductor body 1 in the main radiation direction.

The pump unit comprises a connection carrier 14, as described above. The pump unit also comprises a pump radiation source 2 which has an FAC lens 3 arranged downstream of it. The pump radiation is routed from the FAC lens 3 through an optical element 4 which refracts the pump radiation 17 away from the connection carrier 14. Next, the pump radiation is routed through an aspherical lens 16 which is provided for the purpose of collimating the pump radiation. From there, the pump radiation hits a deflection element 7 which directs the pump radiation onto the radiation passage area 1a of the surface-emitting semiconductor body 1. The pump radiation 17 prompts production of laser radiation 18 at the fundamental frequency in the semiconductor body 1. The laser radiation 18 at the fundamental frequency passes through a recess 30, situated in the carrier 34 of the resonator top element 40, into the resonator top element 40. A deflection element 33 which is formed by a dove prism, for example, directs the laser radiation in the direction of a resonator mirror 31. The laser resonator preferably contains an optically nonlinear crystal 31 which is used for frequency multiplication of the passing laser radiation, for example. A large portion of the converted radiation 19 produced in this way is output from the semiconductor apparatus by the deflection element 33.

Preferably, the optically nonlinear crystal 31 comprises at least one of the following crystals: lithium triborate, for example $LiB_3O_5$ (LBO), bismuth triborate, for example $BiB_3O_6$ (BiBO), potassium titanylphosphate $KTiOPO_4$ (KTP), magnesium-oxide-doped congruent lithium niobate, for example $MgO:LiNbO_3$ (MgO:LN), magnesium-oxide-doped stoichiometric lithium niobate, for example MgO:s-$LiNbO_3$ (MgO:SLN), magnesium-oxide-doped stoichiometric lithium tantalate, for example $MgO:LiTaO_3$ (MgO:SLT), stoichiometric $LiNbO_3$ (SLN), stoichiometric $LiTaO_3$ (SLT), RTP ($RbTiOPO_4$), KTA ($KTiOAsO_4$), RTA ($TbTiOAsO_4$), CTA ($CsTiOAsO_4$).

Preferably, the optically nonlinear crystal is suitable for doubling the frequency of the radiation passing through it.

In addition, the laser resonator may contain a frequency-selective element such as an etalon or a birefringent filter, which advantageously simplifies spectrally stable and narrowband operation of the laser.

Figure 1D:
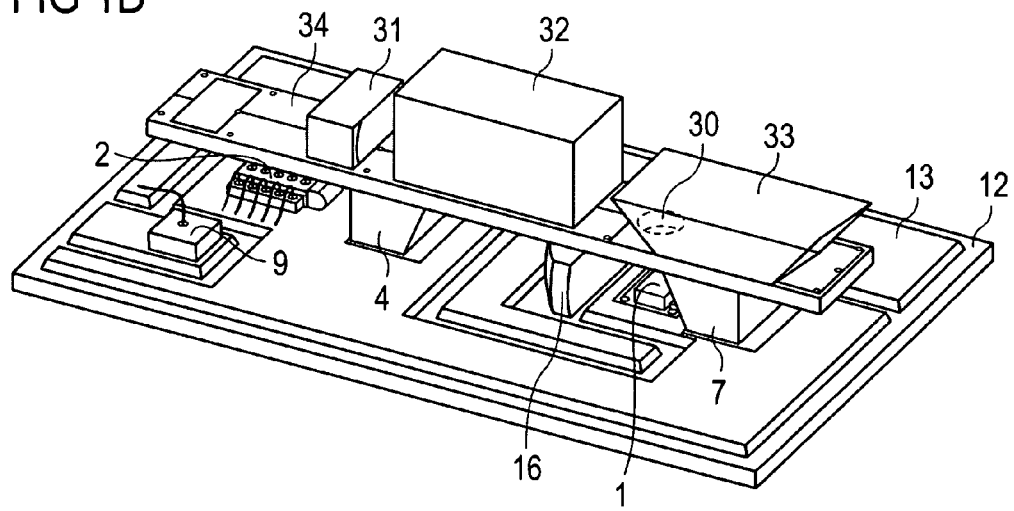
FIG. 1D shows a schematic perspective view of the semiconductor apparatus fabricated in line with the method described here, based on the second exemplary embodiment.

FIG. 1D shows a schematic perspective view of the semiconductor apparatus fabricated in line with the method described here, based on the second exemplary embodiment.

Figure 1E:
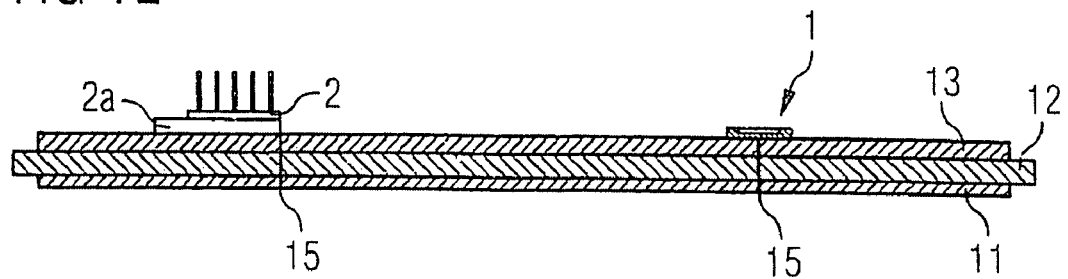
FIG. 1E shows a schematic sectional view of the pump unit in a semiconductor apparatus fabricated in line with the method described here, based on the first or the second exemplary embodiment of the semiconductor apparatus.

FIG. 1E shows a schematic sectional illustration of the pump unit in a semiconductor apparatus fabricated in line with the method described here, based on the first or the second exemplary embodiment, before passive optical elements are disposed.

Figure 1F:
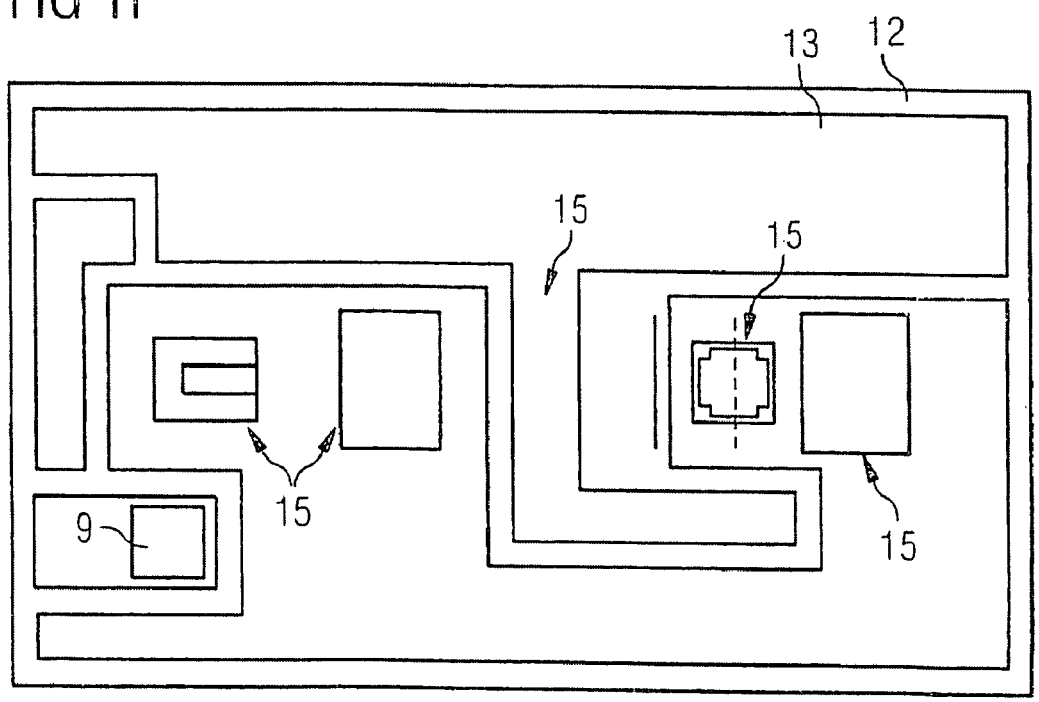
FIG. 1F shows a schematic plan view of the pump unit in a semiconductor apparatus fabricated in line with the method described here, based on the first or the second exemplary embodiment.

FIG. 1F shows a schematic plan view of the pump unit in a semiconductor apparatus fabricated in line with the method described here, based on the first or the second exemplary embodiment.

As can be seen from FIGS. 1E and 1F, the connection carrier 14 has secondary alignment markers 15. By way of example, the secondary alignment markers 15 are deposit structures which are in the form of photographically patterned thin layers.

The secondary alignment markers are used as orientation aids for an image processing system which is used to ascertain the deposit positions for the individual elements of the semiconductor apparatus on the connection carrier 14. In this context, the deposit accuracy for the individual elements is preferably between +/−5 μm and +/−50 μm. Particularly preferably, the deposit accuracy is at least +/−10 μm.

Figure 2A:
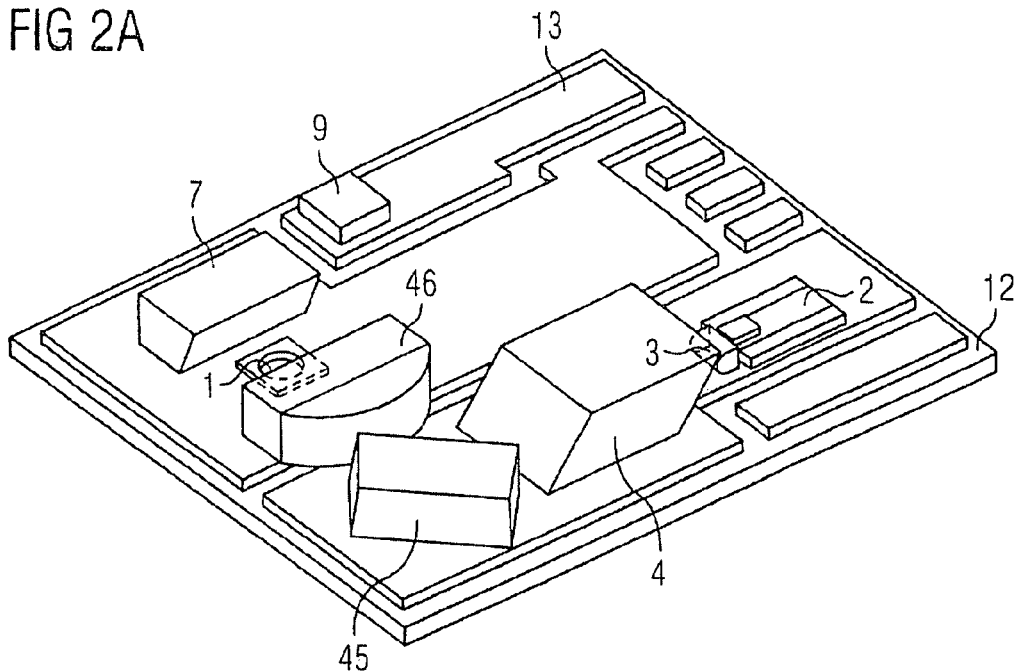
FIG. 2A shows a schematic perspective view of a pump unit in the semiconductor apparatus fabricated in line with the method described here, based on a third exemplary embodiment.

FIG. 2A shows a schematic perspective view of a pump unit in the semiconductor apparatus fabricated in line with the method described here, based on a third exemplary embodiment. In this exemplary embodiment, the base area of the semiconductor apparatus, that is to say the area of the connection carrier 14, is reduced by approximately 30% in comparison with the first two exemplary embodiments. In contrast to the exemplary embodiment described in connection with FIGS. 1A to 1F, the pump radiation source 2, the surface-emitting semiconductor body 1 and the deflection optics 7 are not arranged along a straight line in this case.

Pump radiation passes from the pump radiation source 2 through an FAC lens 3 first of all. From there, the pump radiation passes through an optical element 4 which is formed by a transmission prism or a parallelepiped, for example. From the deflection mirror 45, the pump radiation is then directed onto an aspherical cylinder lens 46 which collimates the pump radiation further. From there, the pump radiation hits the deflection optics 7, which direct the pump radiation onto the radiation passage area of the surface-emitting semiconductor body 1.

Figure 2B:
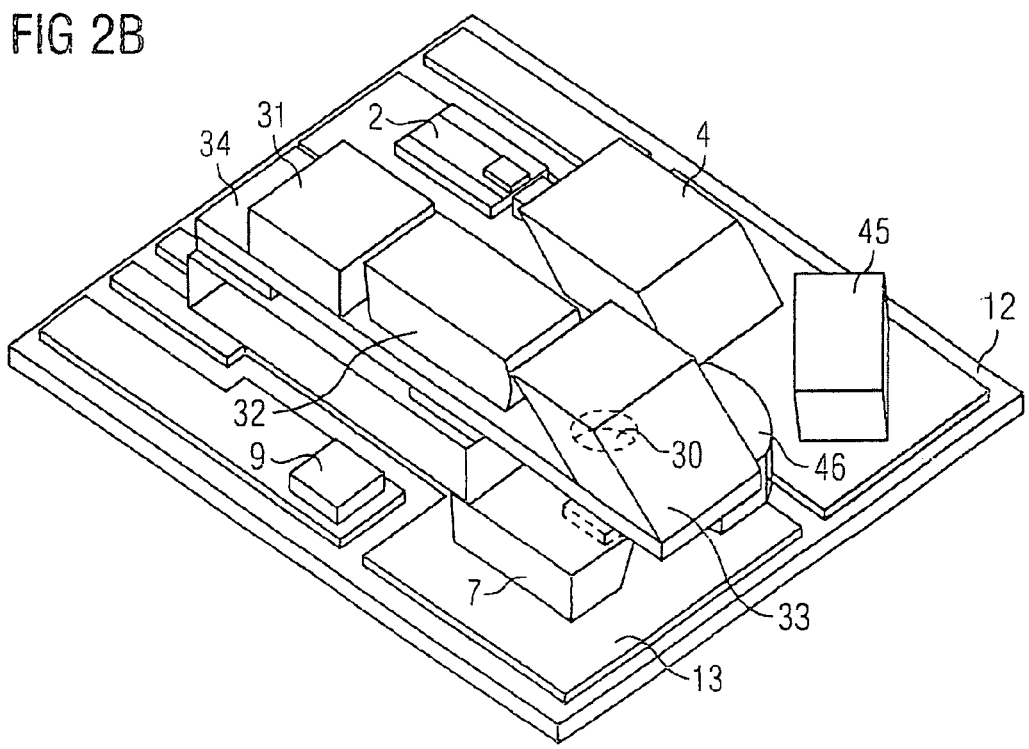
FIG. 2B shows a schematic perspective view of the semiconductor apparatus fabricated in line with the method described here from a first angle.
Figure 2C:
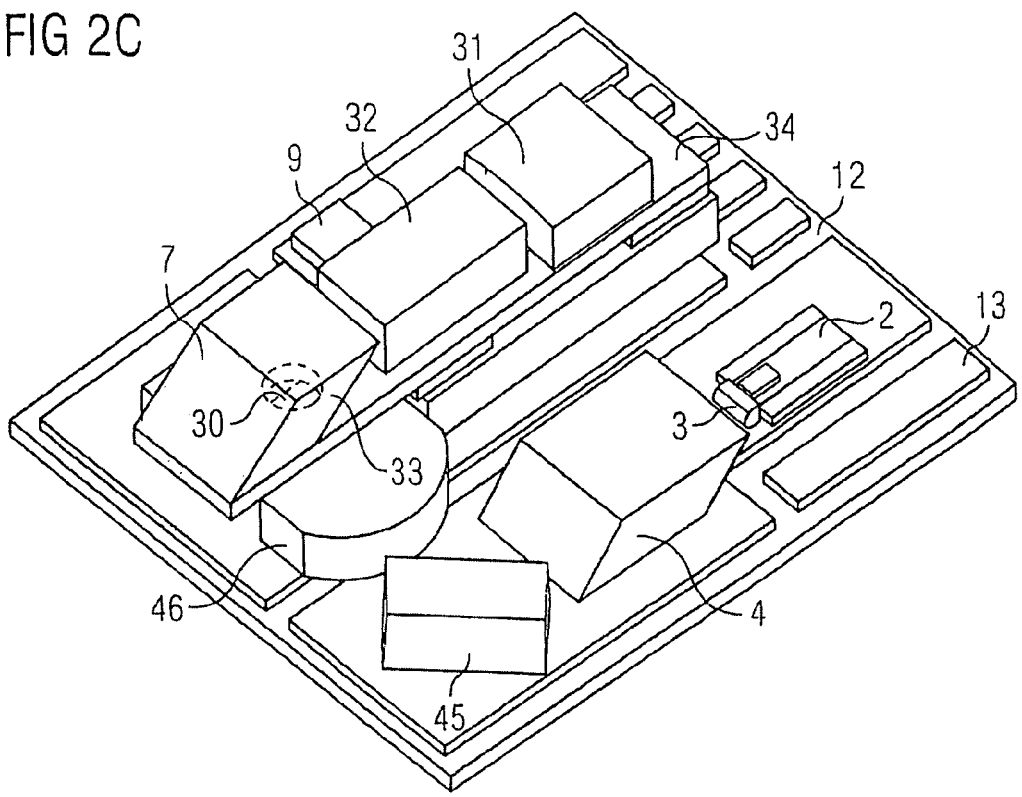
FIG. 2C shows the semiconductor apparatus fabricated in line with the method described here, based on the third exemplary embodiment, from a second angle.

FIG. 2B shows a schematic perspective view from a first angle of the semiconductor apparatus fabricated in line with the method described here. FIG. 2C shows the semiconductor apparatus fabricated in line with the method described here, based on the third exemplary embodiment, from a second angle. In contrast to the exemplary embodiments described in connection with FIGS. 1A to 1F, the deflection optics 33 in the third exemplary embodiment are not formed by a dove prism but rather by a parallelepiped.

Figure 2D:
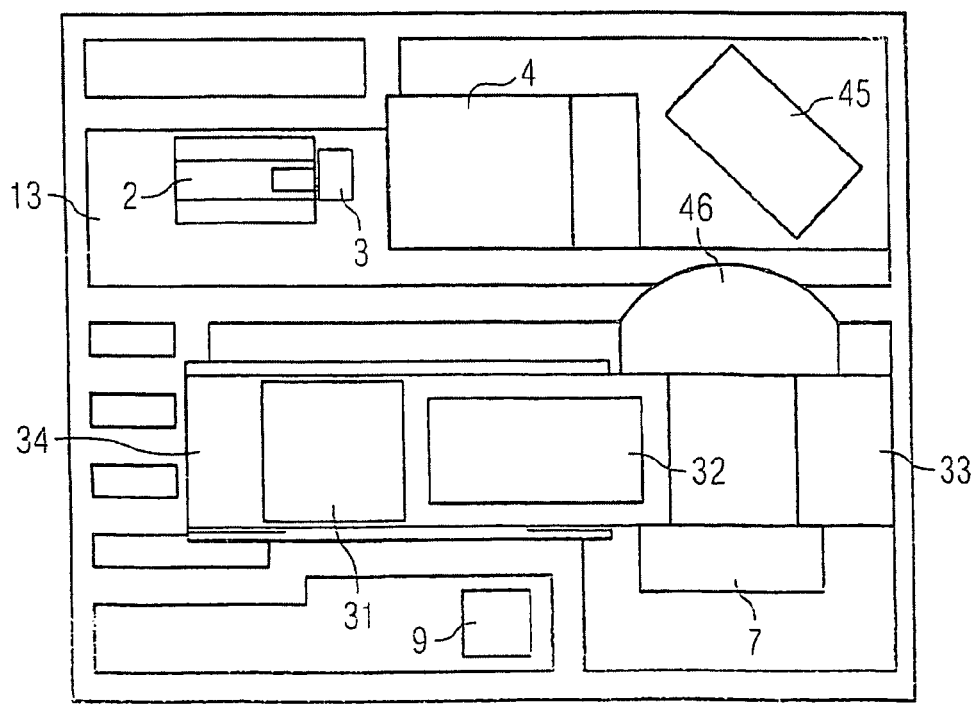
FIG. 2D shows a schematic plan view of the semiconductor apparatus fabricated in line with the method described here, based on the third exemplary embodiment.

FIG. 2D shows a schematic plan view of the semiconductor apparatus fabricated in line with the method described here, based on the third exemplary embodiment.

Figure 2E:
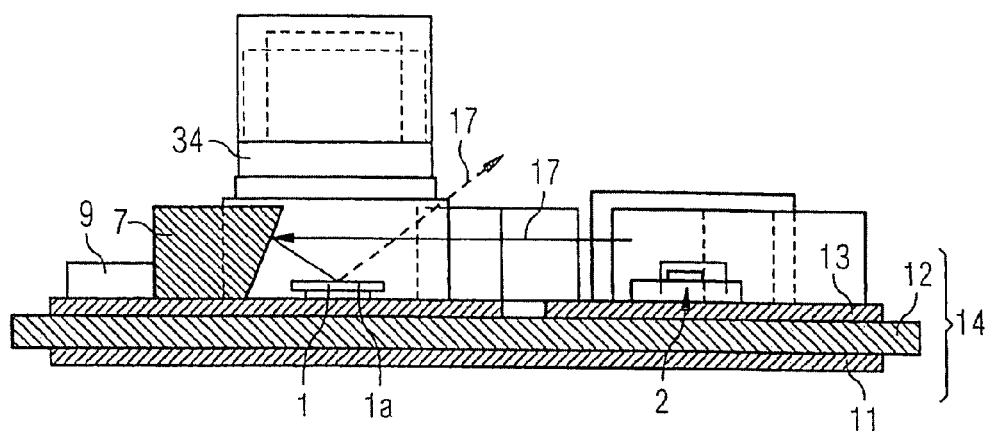
FIGS. 2E and 2F show schematic side views of the semiconductor apparatuses fabricated in line with the method described here, based on the third exemplary embodiment, from different viewing directions.
Figure 2F:
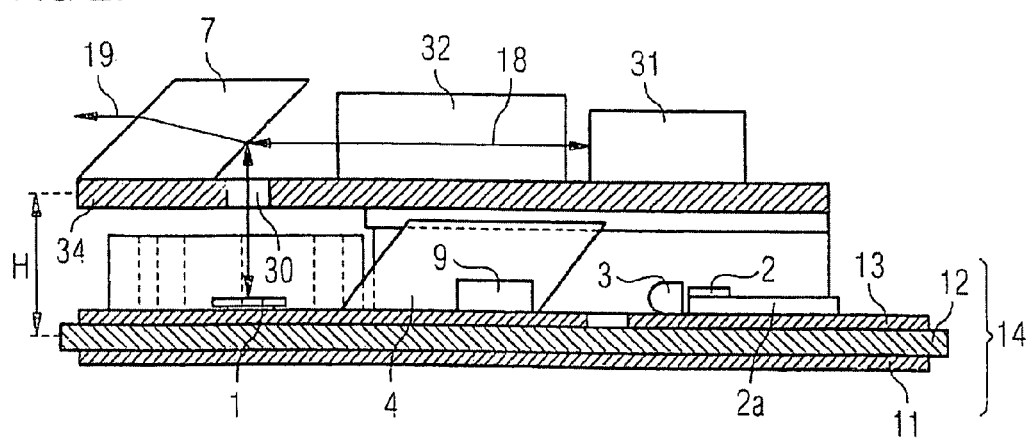

FIGS. 2E and 2F show schematic side views of the semiconductor apparatuses fabricated in line with the method described here, based on the third exemplary embodiment, from different viewing directions.

As can be seen from FIG. 2E, in the case of the semiconductor apparatus based on the second exemplary embodiment, no pump radiation which is possibly reflected on the radiation passage area 1*a* of the surface-emitting semiconductor body 1 enters the optically nonlinear crystal. This advantageously allows particularly stable frequency conversion to take place, since the optically nonlinear crystal 32 cannot be heated by the reflected pump radiation 17.

FIG. 2G shows a schematic side view of the semiconductor apparatus fabricated in line with the method described here, based on the third exemplary embodiment, before it is fitted with the passive optical elements, and FIG. 2H shows the associated schematic plan view.

As can be seen from FIGS. 2G and 2H, the connection carrier 14 has secondary alignment markers 15. That is to say that deposit structures 15 are patterned in the connection carrier 14 which are used as orientation aids for an image processing system. By way of example, the secondary alignment markers 15 are deposit structures which are in the form of photographically patterned thin layers.

The secondary alignment markers are used as orientation aids for an image processing system which is used to ascertain the deposit positions for the individual elements of the semiconductor apparatus on the connection carrier 14. In this case, the deposit accuracy for the individual elements is preferably between +/−5 μm and +/−50 μm. Particularly preferably, the deposit accuracy is at least +/−10 μm.

By way of example, the width y of the connection carrier 14 is between 9 and 13 mm, preferably approximately 10 mm. The length x of the connection carrier 4 is preferably between 9 and 14 mm, for example 12 mm.

FIGS. 3A, 3B, 3C and 3D show a schematic plan view of the fabrication of resonator top elements 40 based on an exemplary embodiment of the method described here. FIG. 3E shows a schematic side view of a resonator top element 40 fabricated in this manner.

Figure 3A:
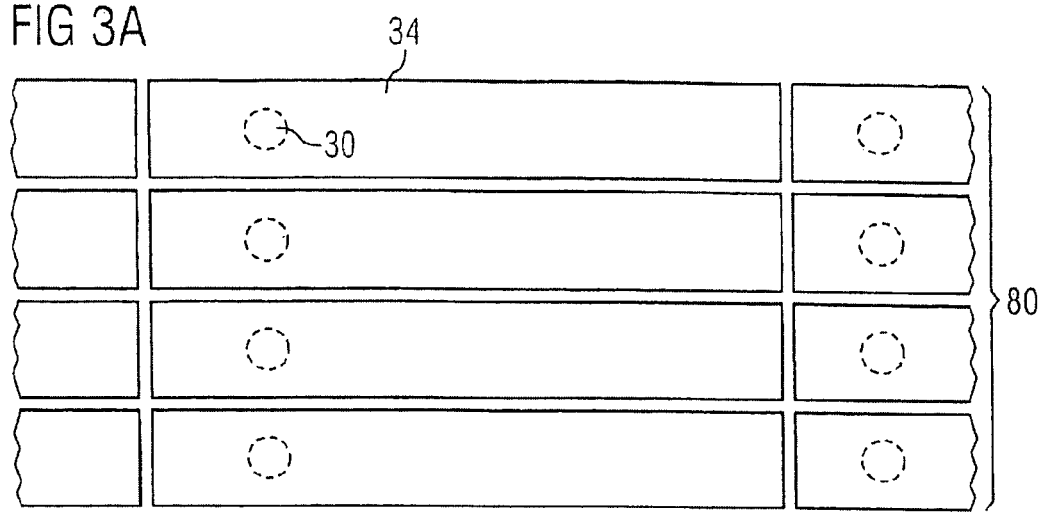
FIGS. 3A, 3B, 3C and 3D show a schematic plan view of the fabrication of resonator top elements 40 based on an exemplary embodiment of the method described here.
Figure 3B:
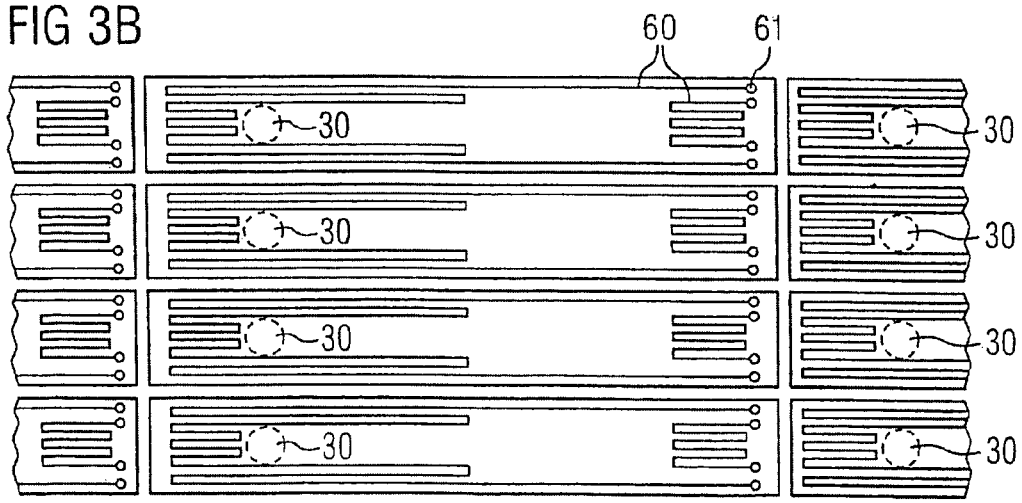

FIG. 3A shows a carrier assembly 80 which comprises a matrix-like arrangement of a multiplicity of individual carrier regions 34. The carrier assembly 80 is formed by a silicon wafer, for example. This is a six-inch or eight-inch silicon wafer, for example. Each individual carrier region 34 has a recess 30—for example a hole.

The recess 30 allows laser radiation to pass into and out of the resonator top element 40.

In a subsequent method step (see FIG. 3B), a patterned metal coating 60 is patterned onto the individual carrier regions 34. By way of example, the metal coating 60 is formed by a meandrous platinum coating which can have electrical contact made with it by means of contact points 61.

Figure 3C:
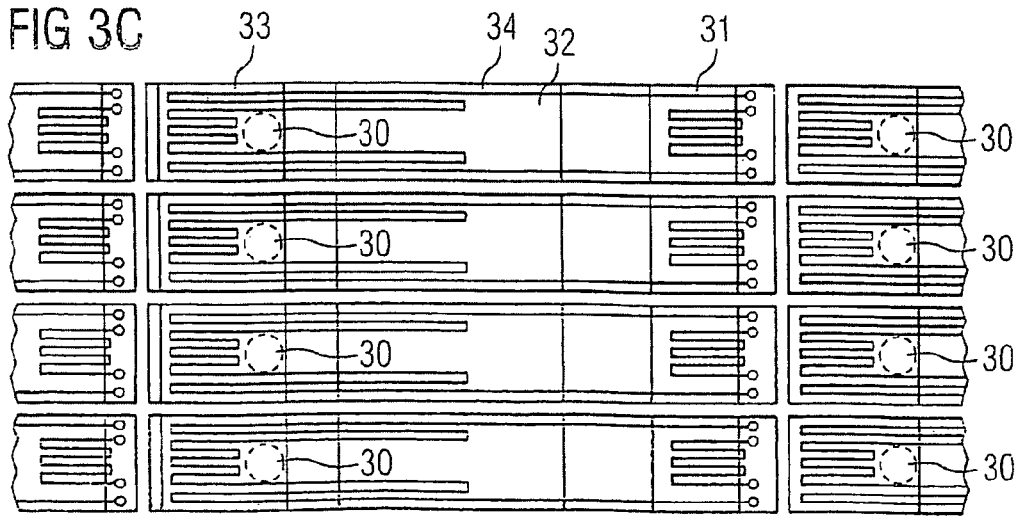

In the method step described in connection with FIG. 3C, optical elements such as a deflection mirror 33, an optically nonlinear crystal 34 and a resonator mirror 31 are arranged on the individual carrier regions 34. Preferably, the optical elements in the assembly—for example in the form of strips which comprise a multiplicity of resonator mirrors 31—are arranged on the carrier assembly 80. This means that a respective one of the optical elements can be arranged on a multiplicity of individual carrier regions 34 at the same time. By way of example, the optical elements can be adhesively bonded on. Preferably, the optical elements are mounted on the individual carrier regions 34 by means of bonding, for example anodic bonding.

Figure 3D:
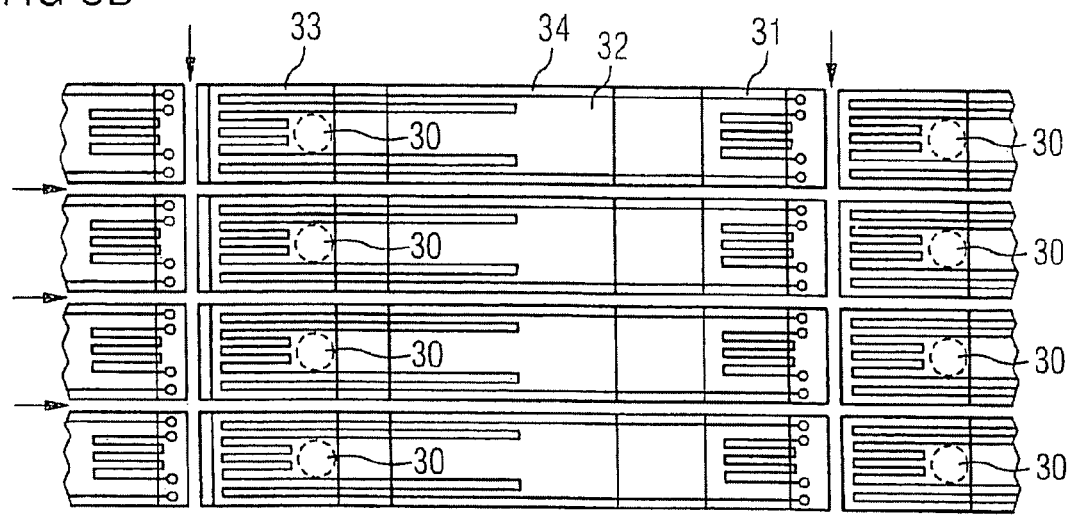
Figure 3E:
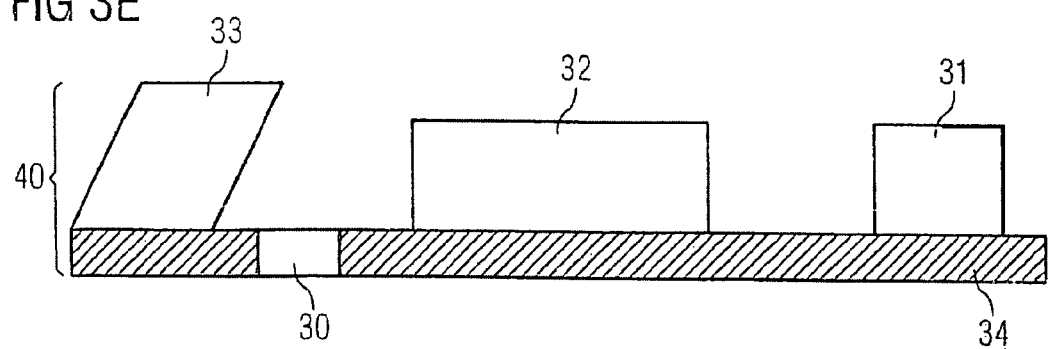
FIG. 3E shows a schematic side view of a resonator top element 40 fabricated in this manner.

In a concluding method step, the carrier assembly 80 can be separated as shown in FIG. 3D, along the arrows indicated therein. In this case, the optical elements arranged in the assembly can also be separated. The result is a multiplicity of resonator top elements 40. One such resonator top element is shown schematically in FIG. 3E, for example.

Figure 3F:
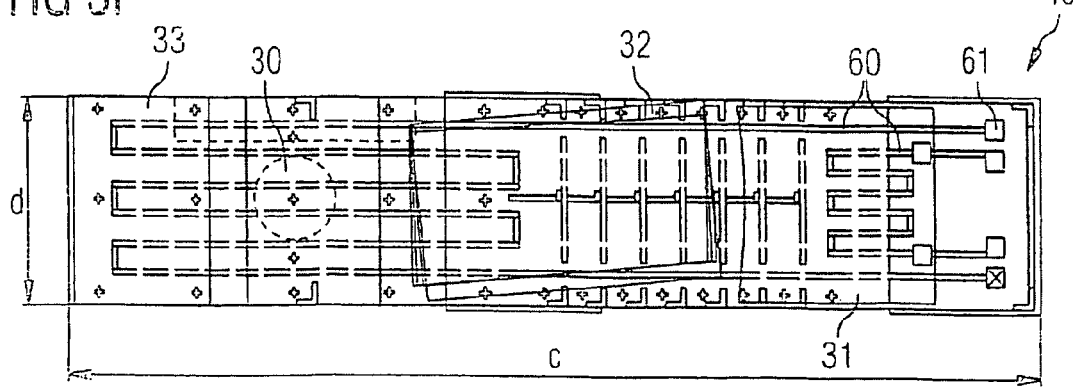
FIG. 3F shows a schematic plan view of a resonator top element 40 fabricated in this manner.

FIG. 3F shows a schematic plan view of the resonator top element 40. Preferably, the length of the resonator top element 40 is between c=8 and c=12 mm, for example c=10 mm. The width of the resonator top element 40 is preferably between d=1.75 mm and d=3 mm, for example d=2.15 mm.

In connection with FIGS. 4A to 4D, a fabrication method for fabricating the resonator mirrors 31 is described, as used in line with an exemplary embodiment of the method described here.

Figure 4A:
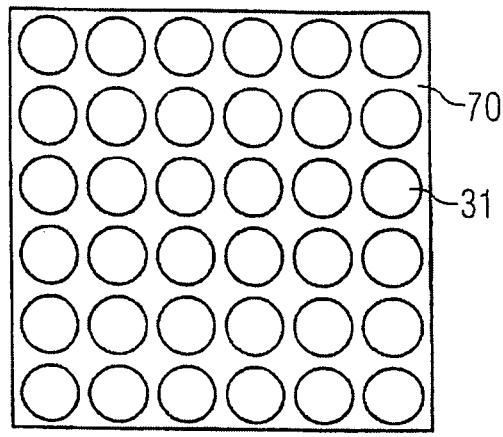

By way of example, this fabrication method involves silicon balls being shaped into a glass wafer 70, so that a multiplicity of resonator mirrors 31 can be produced in an array. FIG. 4A shows the associated schematic plan view of an array produced in this manner.

Figure 4B:
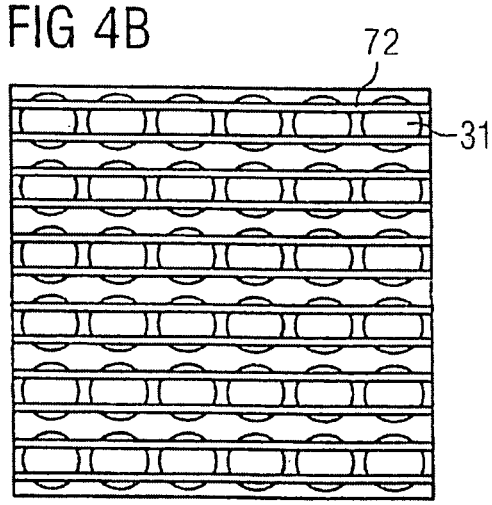
Figure 4C:
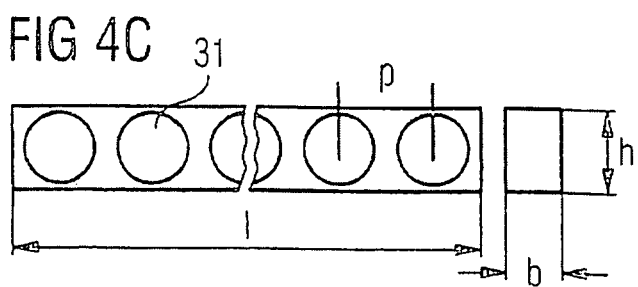
Figure 4D:
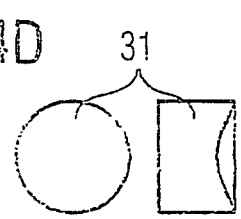

FIG. 4B shows the separation of the array 70 along lines 72. This produces the strips of micromirrors 31 which are shown in FIG. 4C. Such a bar of micromirrors has a length l of approximately 100 mm, for example. The distance p between the individual micromirrors 31 is approximately 2 mm. The height h of the bar is preferably approximately 2 mm, and the width b is preferably between 0.7 and 2.5 mm.

Such a bar of micromirrors can be disposed on a carrier assembly 80 as shown in FIGS. 3A to 3D, for example, and separated together with the carrier assembly 80. However, it is also possible for the strips to be separated into individual resonator mirrors 31 before they are disposed on individual carrier regions 34. Such resonator mirrors 31 are shown schematically in a plan view and a sectional view in FIG. 4D.

FIG. 5 shows a connection carrier assembly 50 having a multiplicity of connection carriers 14 arranged in the manner of a matrix, as used in an exemplary embodiment of the method described here.

The connection carrier assembly 50 has primary alignment markers 51 which are arranged diagonally at two corners of the connection carrier assembly 50. By way of example, the primary alignment markers 51 may be thin-layer patternings in the material of the connection carrier assembly 50. It is also possible for the primary alignment markers 51 to be alignment chips, which may consist of silicon, glass or a ceramic, for example. These alignment chips may have thin-layer patternings. The primary alignment markers are used to align all the elements on the connection carrier assembly 50. The connection carrier assembly 50 forms a blank in this case. Since the individual elements in the blank are a unit, the following mounting processes are possible:

- elements are mounted as strips in one step and are later separated together with the blank,
- prism strips or lens strips are disposed,
- individual parts are mounted, which are placed in a suction tool in the manner of a matrix and so as to be self-aligning.

On account of the regular matrix-like arrangement of the connection carriers 14 in the connection carrier assembly 50, sequential or simultaneous arrangement of a multiplicity of elements is possible in one step.

The connection carrier assembly can be separated by sawing or scoring and breaking, for example. In this case, the connection carrier assembly 50 is preferably braced on an adhesive film in a frame.

The connection carrier assembly 50 preferably has a size of 50 mm×50 mm to 200 mm×200 mm. It may be round or rectangular. Preferably, the surface roughness of the connection carrier top is less than 1 μm. This allows particularly accurate alignment of the individual elements on the connection carrier.

FIG. 6A shows a schematic plan view of a connection carrier assembly 50 with a multiplicity of connection carriers 14 arranged in the manner of a matrix, as used in a further exemplary embodiment of the method described here.

The length f of the connection carrier assembly 50 is between 100 and 120 mm, for example, preferably 110 mm. The width e of the connection carrier assembly 50 is preferably between 45 and 65 mm, for example 55 mm. In this exemplary embodiment, the connection carrier assembly 50 comprises 11 times 4 connection carriers 14.

FIG. 6B shows a schematic plan view of the back of the connection carrier assembly 50.

FIG. 6C shows a schematic side view of the connection carrier assembly 50. The width j of the basic body 12, which contains an aluminum nitride or which consists of an aluminum nitride, for example, is preferably between 0.25 and 0.45 mm, for example 0.38 mm. The thickness i of the bottom metallization 11, which consists of copper, for example, is preferably between 0.2 and 0.4 mm, for example 0.3 mm. The thickness g of the patterned top metallization 13, which consists of copper, for example, is preferably between 0.2 and 0.3 mm, for example 0.25 mm.

FIG. 6D shows a schematic plan view of a connection carrier 14 in the connection carrier assembly 50. A connection carrier 14 has wire bonding areas 163 which are provided for the purpose of making electrical contact with components on the connection carrier 14 by means of a bonding wire. In addition, the connection carrier 14 has solder areas 164 on which active components can be disposed. The connection carrier 14 also has a solder stop layer 165.

The semiconductor apparatus fabricated using one of the methods described here is distinguished, inter alia, by its particularly compact design. By way of example, this allows a resonator length of a few millimeters, preferably no more than 15 mm, particularly preferably no more than 10 mm. Such a short resonator length allows particularly rapid response times during laser production, as are advantageous for optical projection applications, for example. The semiconductor apparatus fabricated using one of the methods described here is also distinguished, inter alia, by virtue of particularly the components which produce heat during operation, such as the pump radiation source and the surface-emitting semiconductor body, being disposed on a carrier with high thermal conductivity using planar mounting. This allows the heat produced during operation to be passed directly to the carrier and means that it does not need to be deflected by a particular angle, for example. In addition, the thermal decoupling of the pump unit and the resonator top element allows a particularly stable temperature for the optically nonlinear crystal. This means that it is possible to produce particularly uniform laser radiation in the visible range, for example.

The invention is not limited by the description with reference to the exemplary embodiments. Rather, the invention comprises any new feature and any combination of features, which includes particularly any combination of features in the patent claims, even if this feature or this combination itself is not explicitly indicated in the patent claims or exemplary embodiments.

The invention claimed is:

1. A method for fabricating an optically pumped semiconductor apparatus, comprising:
    providing a connection carrier assembly comprising a plurality of connection carriers which are permanently connected to one another mechanically;
    arranging a surface-emitting semiconductor body on a connection carrier in the connection carrier assembly;
    arranging a pump radiation source on a connection carrier of the plurality of connection carriers in the connection carrier assembly, the pump radiation source being configured to optically pump the surface-emitting semiconductor body which is arranged on a same connection carrier as the pump radiation source;
    arranging a temperature sensor on each connection carrier of the plurality of connection carriers, the temperature sensor determining an average temperature of a respective connection of the plurality of connection carriers, and an operating temperature of the pump radiation source being adjusted by a thermo electric cooler depending on the determined average temperature of the respective connection carrier; and
    at least partially finishing the semiconductor apparatus.

2. The method for fabricating an optically pumped semiconductor apparatus, comprising:
    providing a connection carrier assembly comprising a plurality of connection carriers which are permanently connected to one another mechanically;
    arranging a surface-emitting semiconductor body on a connection carrier in the connection carrier assembly;
    arranging a pump radiation source on a connection carrier of the plurality of connection carriers in the connection carrier assembly, the pump radiation source being configured to optically pump the surface-emitting semiconductor body which is arranged on a same connection carrier as the pump radiation source, and the surface-emitting semiconductor body being arranged in a mounting plane of the surface-emitting semiconductor body between the pump radiation source and an optical element along a straight line, respectively, so that pump radiation generated during operation of the pump radiation source flows over the surface-emitting semiconductor body before being directed onto a radiation passage area of the surface-emitting semiconductor body; and
    at least partially finishing the semiconductor apparatus.

3. The method as claimed in claim 2, further comprising:
    arranging at least one optical element, which is configured to direct pump radiation onto the radiation passage area of the semiconductor body, on the connection carrier in the connection carrier assembly.

4. The method as claimed in claim 2, further comprising:
    arranging the plurality of connection carriers in the connection carrier assembly in a matrix.

5. The method as claimed in claim 2, further comprising:
    placing an assembly of similar elements is placed onto the connection carrier assembly.

6. The method as claimed in claim 2, wherein the connection carrier assembly has two primary alignment markers.

7. The method as claimed in claim 2, wherein one connection carrier in the connection carrier assembly has at least one secondary alignment marker.

8. The method as claimed in claim 2, further comprising:

arranging a resonator top element on a connection carrier of the plurality of connection carriers.

9. A method for fabricating a resonator top element for the optically pumped semiconductor apparatus fabricated in accordance with claim 2, further comprising:

providing a carrier assembly, comprising a plurality of individual carrier regions which are permanently connected to one another mechanically;

arranging a resonator mirror on an individual carrier region; and finishing of individual resonator top elements.

10. The method as claimed claim 9, further comprising:

arranging a radiation deflection element on an individual carrier region of the carrier assembly.

11. The method as claimed in claim 9, wherein the individual carrier regions in the carrier assembly are arranged in a matrix.

12. The method as claimed in claim 11, wherein an assembly of similar elements is placed onto the carrier assembly.

13. The method as claimed in claim 9, wherein at least one element is mounted on an individual carrier region of the carrier assembly by bonding.

14. The method as claimed in claim 9, further comprising:

disposing a pattern metal layer on an individual carrier region of the connection carrier assembly, said patterned metal layer being configured for electrical contact with said individual carrier region.

15. The method as claimed in claim 9, wherein each resonator top element is electrically conductively connected to an associated connection carrier.

* * * * *